(12) United States Patent
Hattori et al.

(10) Patent No.: US 7,423,350 B2
(45) Date of Patent: Sep. 9, 2008

(54) POWER GENERATING DEVICE AND TIRE PROVIDED THEREWITH

(75) Inventors: Yutaka Hattori, Kanagawa (JP); Yasuo Hatano, Kanagawa (JP)

(73) Assignee: The Yokohama Rubber Co., Ltd, Tokyo (JP)

( * ) Notice: Subject to any disclaimer, the term of this patent is extended or adjusted under 35 U.S.C. 154(b) by 26 days.

(21) Appl. No.: 11/660,082

(22) PCT Filed: Aug. 10, 2005

(86) PCT No.: PCT/JP2005/014650

§ 371 (c)(1),
(2), (4) Date: Feb. 9, 2007

(87) PCT Pub. No.: WO2006/016604

PCT Pub. Date: Feb. 16, 2006

(65) Prior Publication Data

US 2007/0205691 A1   Sep. 6, 2007

(30) Foreign Application Priority Data

Aug. 11, 2004  (JP) .............................. 2004-234148

(51) Int. Cl.
*H02K 35/04* (2006.01)
(52) U.S. Cl. ......................................................... 290/1
(58) Field of Classification Search ....................... 290/1
See application file for complete search history.

(56) References Cited

U.S. PATENT DOCUMENTS 3,786,413 A * 1/1974 Matthews et al. ........... 340/443
4,504,761 A * 3/1985 Triplett ....................... 310/339
6,438,193 B1 * 8/2002 Ko et al. ..................... 377/24.1
6,909,221 B2 * 6/2005 Ayazi et al. ................. 310/321

(Continued)

FOREIGN PATENT DOCUMENTS

JP        63-305744        12/1988

(Continued)

OTHER PUBLICATIONS

International Search Report dated Sep. 13, 2005 for PCT/JP2005/014650 filed Aug. 10, 2005.

*Primary Examiner*—Joseph Waks
(74) *Attorney, Agent, or Firm*—Knobbe, Martens, Olson & Bear LLP

(57) ABSTRACT

An object of the present invention is to provide a power generating device which makes it possible to easily generate electric power in a rotating system, such as a wheel including a tire, without impairing the performance and reliability of the rotating system. In the case where the power generating device is mounted to a rotating body such as a tire, the direction of gravity applied to a weight is changed with the rotation of the rotating body to cause beams to be deflected, so that the positions of the deflected beams and the weight are fluctuated in synchronization with the period of the rotation to cause the position of a coil to be displaced. Thereby, the weight is vibrated in the vertical direction in synchronization with the period of the rotation of the rotating body to change the magnetic flux density crossing the coil. As a result, AC electromotive forces are generated in the coil to enable electric power to be generated.

19 Claims, 13 Drawing Sheets

U.S. PATENT DOCUMENTS

| | | | |
|---|---|---|---|
| 7,256,505 B2 * | 8/2007 | Arms et al. | 290/1 R |
| 7,361,998 B2 * | 4/2008 | Hamel et al. | 290/1 R |
| 2004/0100100 A1 * | 5/2004 | Wilson | 290/1 R |
| 2006/0006991 A1 * | 1/2006 | Tyndall et al. | 340/442 |
| 2006/0243043 A1 * | 11/2006 | Breed | 73/146 |

FOREIGN PATENT DOCUMENTS

| | | |
|---|---|---|
| JP | 2000-032732 | 1/2000 |
| JP | 2001-086723 | 3/2001 |
| JP | 2004-007864 | 1/2004 |
| JP | 2004-023904 | 1/2004 |
| WO | WO 03/095244 A1 | 11/2003 |
| WO | WO 03/095245 A1 | 11/2003 |

* cited by examiner

POWER GENERATING DEVICE AND TIRE PROVIDED THEREWITH

CROSS REFERENCE TO RELATED APPLICATION

This application claims the benefit and priority to and is a U.S. National Phase of PCT International Application Number PCT/JP2005/014650, filed on Aug. 10, 2005, designating the United States of America, which claims priority under 35 U.S.C. § 119 to Japanese Application Number 2004-234148 filed on Aug. 11, 2004. The disclosures of the above-described applications are hereby incorporated by reference in their entirety.

TECHNICAL FIELD

The present invention relates to a power generating device which is provided in a rotating system and generates electric power in accordance with the rotation of the rotating system, and to a tire provided with the power generating device.

BACKGROUND ART

Conventionally, the development of a system which has a sensor module installed in a tire air space of a vehicle or the like, and which collects tire environment related physical quantities such as air pressure and temperature to inform the driver of deterioration of the environment in real time, has been energetically performed.

Generally, the sensor module is constituted by using an electronic circuit and hence needs electric power supply. However, the sensor module is installed in the tire air space in most cases, and the power supply to the sensor module from the outside of the tire is difficult. Thus, in many cases, the sensor module is driven by using a battery.

However, since it takes much time to replace the battery in the battery drive, a device for supplying electric power to the tire, which can substitute for the battery, is also developed (Japanese Patent Publication 2004-23904). This device comprises: a stator which is provided for a non-rotating part of an axle and forms a magnetic field; a rotor which is fixed to a rotating part of the axle, rotates in the magnetic field and generates an electromotive force; and a power transmission part which transmits the electromotive force generated by the rotor to an in-space apparatus. Further, in the stator, N poles and S poles which form the magnetic field advancing to the axle center are alternately arranged on a circumference around the axle center. The rotor comprises: a plurality of rotating yokes, each of which has one end fixed to the rotating part of the axle at a position corresponding to the stator in the axle axial direction and the other end positioned near the inside and in the radial direction of the stator, and is formed of a high-permeability magnetic material; coupling yokes which magnetically couple the rotating yokes; and rotating coils which are spirally wound around the rotating yokes along the axle radial direction to generate electromotive forces in accordance with the rotation of the axel.

Further, power generating devices which generate electric power by providing a piezoelectric element in a tire are also developed (WO03/095244, WO03/095245). These devices are constituted in such a manner that a structural body having a piezoelectric element formed in a fiber-like state is embedded in the tire to enable electric power to be outputted from the piezoelectric element by deformation of the piezoelectric element caused by the deformation of the tire.

[Patent document 1]: Japanese Patent Publication 2004-23904
[Patent document 2]: WO03/095244
[Patent document 3]: WO03/095245

DISCLOSURE OF THE INVENTION

Problems to be Solved by the Invention

However, in the device of the above described prior art form (Patent document 1), a special structure needs to be adopted for the axle itself, which results in a high cost and makes it difficult for the device to be used for an existing vehicle. Therefore, the device needs to be improved in order to make it generally and widely used.

Further, in the device of the above described prior art form (Patent documents 2 and 3), the above described structural body needs to be embedded in the tire, which makes it very difficult to maintain the performance and reliability of the tire.

In view of the above described problems, an object of the present invention is to provide a power generating device which makes it possible to easily generate electric power in a rotating system such as a wheel including a tire without impairing the performance and reliability of the rotating system, and a tire provided with the power generating device.

Means for Solving the Problems

In order to achieve the above described object, a power generating device, according to the present invention, which has a predetermined rotating shaft in the direction different from the direction of gravity, which is provided in a rotating body rotating at a predetermined period about the rotating shaft, and which generates electric power while rotating about the rotating shaft, is constituted by having a generator comprising: a flexible beam which is fixed to a substrate; a weight which is supported by the beam, and the position of which is fluctuated in synchronization with the period of the rotation by deflection of the beam caused in accordance with the rotation; and AC generating means which generates AC power synchronized with the period of the rotation by the fluctuation of the weight.

According to the present invention, in the power generating device provided in the above described rotating body, the direction of gravity applied to the weight is changed in accordance with the rotation of the rotating body so as to cause the beam to be deflected, whereby the positions of the deflected beam and the weight are changed in synchronization with the period of the rotation, so as to enable the AC generating means to generate AC power synchronized with the period of the rotation. That is, the power generating device is rotated about the rotating shaft provided in the direction different from the direction of gravity, and thereby a resultant force between a centrifugal force following the rotation and the gravity is applied to the weight, as a result of which the position of the weight is fluctuated in synchronization with the period of the rotation in accordance with the fluctuation of the resultant force and the rotation. This positional fluctuation of the weight enables the AC generating means to generate AC power synchronized with the period of the rotation.

Further, the AC generating means is constituted by using a permanent magnet and a coil, or by using a piezoelectric element.

Advantages of the Invention

According to the power generating device of the present invention, only by providing the power generating device for a rotating body, AC power synchronized with the period of the rotation can be generated by the fluctuation of the position of the weight caused in accordance with the rotation, as a result of which it is possible to easily supply electric power to, for example, the sensor module of the prior art form.

DESCRIPTION OF SYMBOLS 10, 30, 50 . . . Power generating device, 11, 31 . . . Substrate, 12A, 12B, 32A, 32B . . . Land, 13, 33 . . . Wiring conductor pattern, 14A, 14B, 34A, 34B . . . Terminal electrode, 15 . . . Solder, 20 . . . Tire, 21 . . . Tire body, 22 . . . Rim, 23 . . . Rotating shaft, 100, 100A . . . Generator, 101, 102 . . . External terminal electrode, 110 . . . Silicon substrate, 111 . . . Beam, 112 . . . Rectangular part, 113 . . . Weight, 121 . . . Coil, 122, 123 . . . Wiring pattern, 131 . . . Magnetic material layer, 200 . . . Rectifier, 201 to 204 . . . Diode, 211, 212 . . . Input terminal, 213, 214 . . . Output terminal, 300 . . . Capacitor, 400 (400A, 400B, 400C, 400D) . . . Power generating module, 500 . . . Rectifier, 501 to 504 . . . Diode, 511, 512 . . . Input terminal, 513, 514 . . . Output terminal, 600 . . . Capacitor, 700 . . . Power generating module, 800 . . . Generator, 801, 802 . . . External terminal electrode, 810 . . . Silicon substrate, 811 . . . Beam, 812 . . . Rectangular part, 813 . . . Weight, 821 . . . Piezoelectric element, 822, 823 . . . Wiring pattern

BEST MODE FOR CARRYING OUT THE INVENTION

Figure 1:
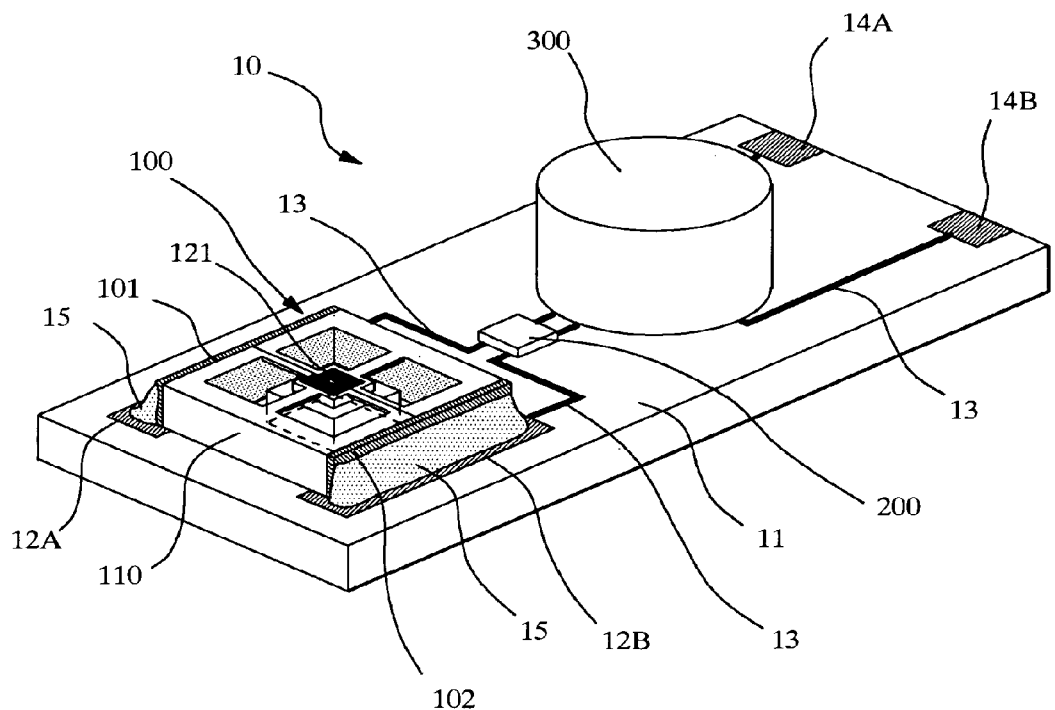
FIG. 1 is an external perspective illustration showing a power generating device in a first embodiment according to the present invention.
Figure 2:
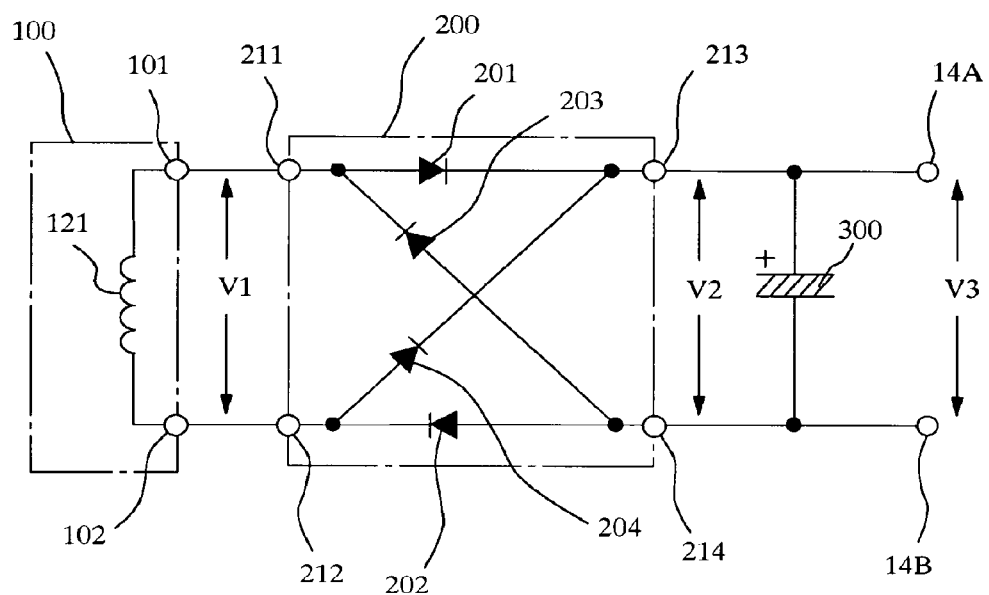
FIG. 2 is an electric system circuit diagram of the power generating device in the first embodiment according to the present invention.
Figure 3:
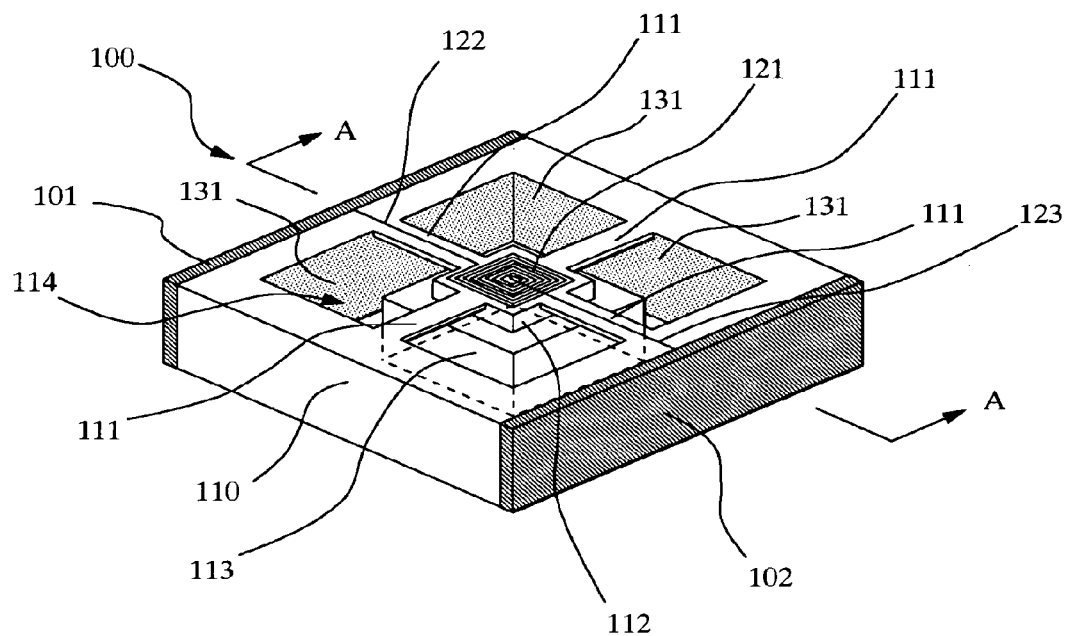
FIG. 3 is an external perspective illustration showing a generator in the first embodiment according to the present invention.
Figure 4:
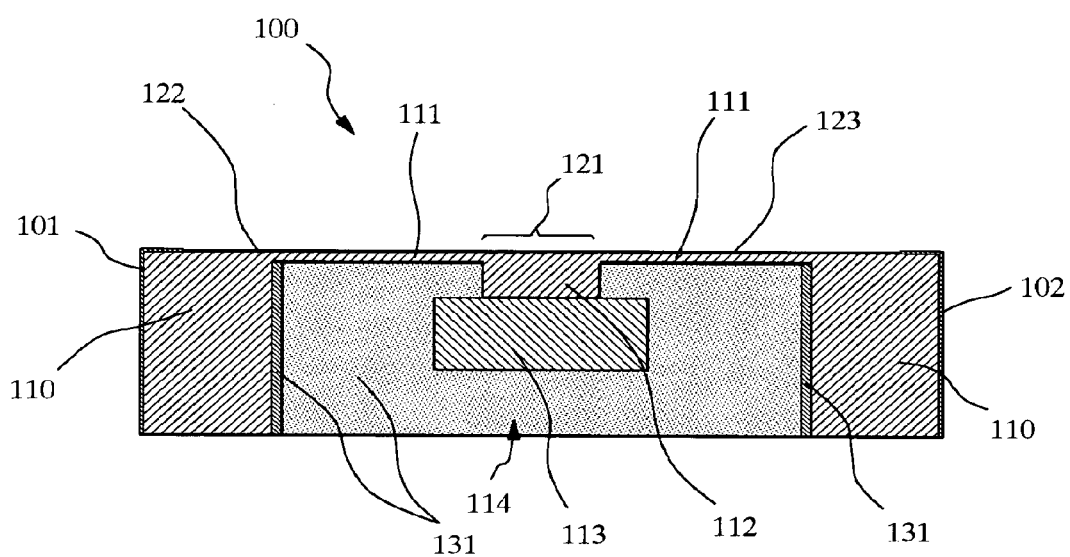
FIG. 4 is a sectional view along the line A-A shown in FIG. 3.

FIG. 1 to FIG. 4 show a first embodiment according to the present invention. FIG. 1 is an external perspective illustration showing a power generating device in the first embodiment according to the present invention. FIG. 2 is an electric system circuit diagram of the power generating device in the first embodiment according to the present invention. FIG. 3 is an external perspective illustration showing a generator in the first embodiment according to the present invention. FIG. 4 is a sectional view along the line A-A shown in FIG. 3.

In the figures, reference numeral 10 denotes a power generating device which is provided with an insulative substrate 11, and a generator 100, a rectifier 200 and a capacitor 300 which are arranged on the substrate 11.

The substrate 11 is formed to have a rectangular plate-like shape, and component mounting lands 12A and 12B, wiring conductor pattern 13, and terminal electrodes 14A and 14B, each of which is made of a conductive body, are formed on the upper surface of the substrate 11.

Further, external terminal electrodes 101 and 102 of the generator 100 are conductively connected to the lands 12A and 12B by solder 15, and thereby the generator 100 is fixed on the substrate 11. Further, on the substrate 11, the rectifier 200 and the capacitor 300 are fixed by soldering to lands (not shown) connected to the wiring conductor pattern 13.

Further, the generator 100, the rectifier 200, and the capacitor 300 are connected by a wiring conductor pattern as shown in FIG. 2. That is, one end of a coil 121 provided for the generator 100 is connected to one input terminal 211 of the rectifier 200 via the external terminal electrode 101. Further, the other end of the coil 121 is connected to the other input terminal 212 of the rectifier 200 via the external terminal electrode 102.

The rectifier 200 is constituted by a known full-wave rectifier circuit consisting of four diodes 201 to 204. The anode of the diode 201 and the cathode of the diode 203 are connected to the one input terminal 211 of the rectifier 200, and the cathode of the diode 202 and the anode of the diode 204 are connected to the other input terminal 212. Further, the cathode of the diode 201 and the cathode of the diode 204 are connected to one output terminal 213. The anode of the diode 202 and the anode of the diode 203 are connected to the other output terminal 214.

The one output terminal 213 of the rectifier 200 is connected to a positive electrode terminal of the capacitor 300 consisting of a large capacity capacitor generally referred to as a super capacitor and to the terminal electrode 14A. The other output terminal 214 of the rectifier 200 is connected to a negative electrode terminal of the capacitor 300 and the terminal electrode 14B. Thus, when AC power is generated in the coil 121, the resultant AC voltage V1 is converted to a voltage V2 which is full-wave rectified by the rectifier 200. Thereafter, the voltage V2 is smoothed by being stored in the capacitor 300, so as to be outputted as a DC voltage V3 from the terminal electrodes 14A and 14B.

On the other hand, as shown in FIG. 3 and FIG. 4, the generator 100 is mainly constituted by a silicon substrate (silicon wafer) 110. A cavity 114 whose bottom part is opened is formed in the central part of the silicon substrate 110. Thin film beams 111 which are formed into a cross shape and fixed to the silicon substrate 110 are provided on the upper part, that is, one of the opening surfaces of the cavity 114.

Further, a rectangular part 112 having a predetermined area is formed in the crossing part of the beams 111, and the coil 121 is formed on the upper surface of the rectangular part 112. One end of the coil 121 is connected to the external terminal electrode 101 formed on the one side surface of the substrate 110 via a wiring pattern 122 provided on the upper surface of one of the beams 111. Further, the other end of the coil 121 is connected to the external terminal electrode 102 formed on the other side surface of the substrate 110 via a wiring pattern 123 provided on the upper surface of the other of the beams 111.

Further, under the rectangular part 112 in the crossing part of the beams 111, a weight 113 is provided so as to be fixed to the rectangular part 112.

Further, a magnetic material layer 131 which is magnetized to become a permanent magnet is provided on the inner peripheral surface of the cavity 114. The magnetic material layer 131 is formed by using a known method such as vapor deposition and sputtering, and is magnetized so as to be polarized in the vertical direction in the figure. Here, the magnetic material layer 131 is magnetized so that the upper part thereof becomes the N pole, and the lower part thereof becomes the S pole.

Figure 5:
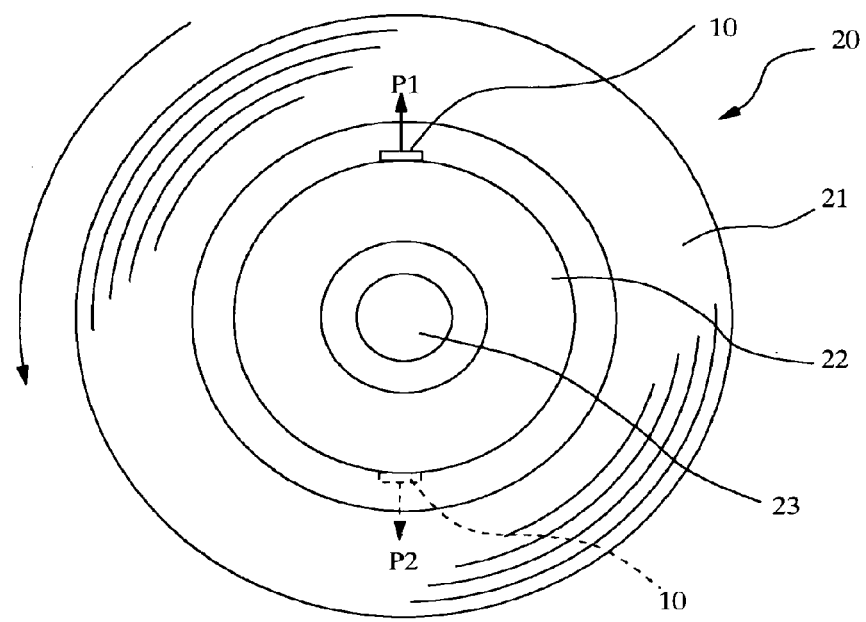
FIG. 5 is a figure explaining an attachment example to a rotating body of the power generating device in the first embodiment according to the present invention.
Figure 6:
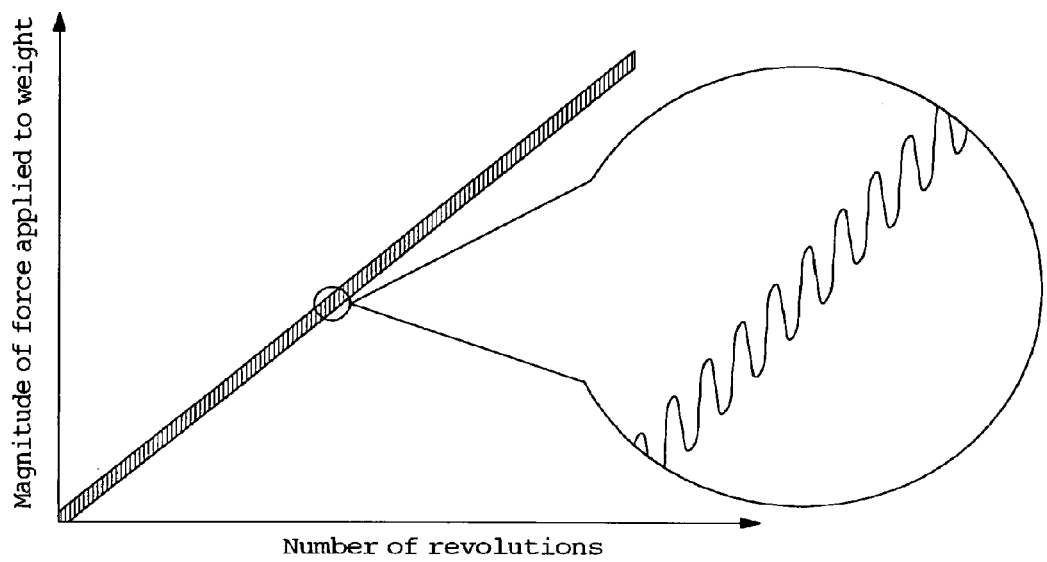
FIG. 6 is a figure explaining a force applied to the generator in the first embodiment according to the present invention.

The power generating device 10 having the above described constitution is suitable for generating electric power by being provided in a rotating body. For example, as shown in FIG. 5, a case where the power generating device 10 is provided in a tire 20 of a vehicle so as to generate electric power is explained as an example. In the constitution shown in FIG. 5, the power generating device 10 is fixed on the peripheral surface of a rim 22 which fixes a tire body 21 in the tire 20. Thus, when the tire 20 is rotated about a rotating shaft 23, the force applied to the weight 113 of the generator 100 is increased as the number of revolutions of the tire 20 is increased as shown in FIG. 6, as a result of which the beams 111 are deflected to cause the positions of the weight 113 and the coil 121 to be displaced. Further, the weight 113 is vibrated in the vertical direction in synchronization with the rotation of the tire 20, and thereby the density of magnetic flux crossing the coil 121 is changed to cause AC electromotive forces to be generated in the coil 121.

Figure 7:
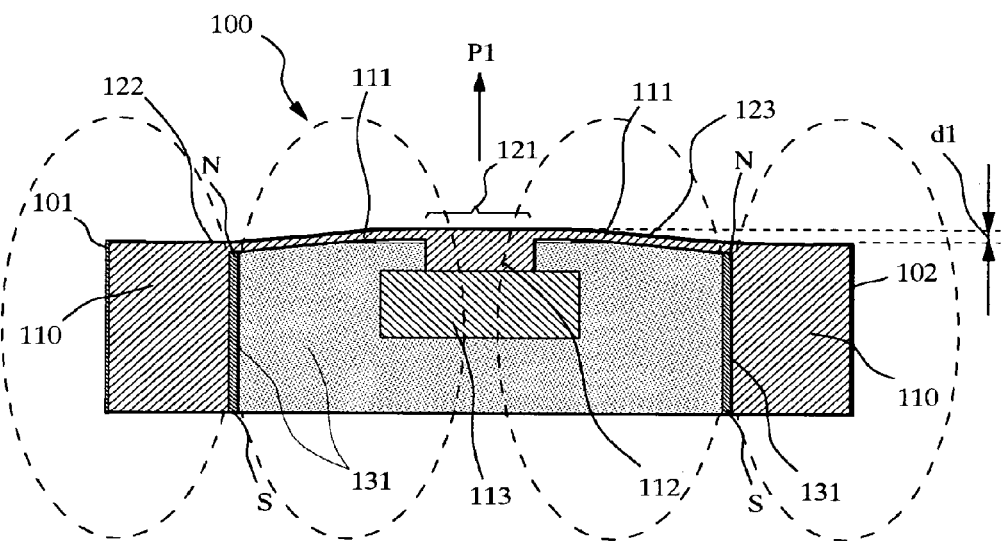
FIG. 7 is a figure explaining the force applied to the generator in the first embodiment according to the present invention.
Figure 8:
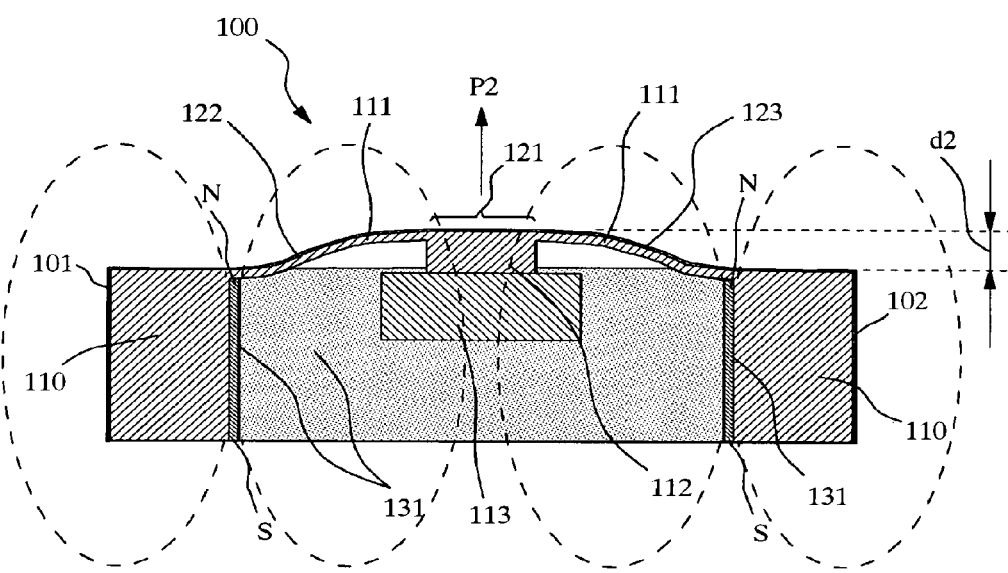
FIG. 8 is a figure explaining the force applied to the generator in the first embodiment according to the present invention.
Figure 9:
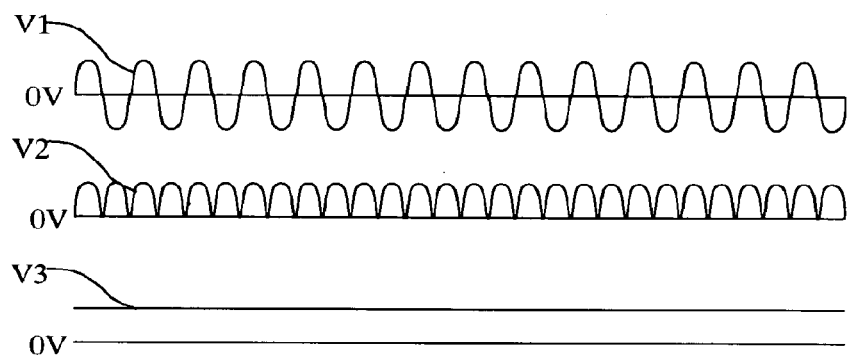
FIG. 9 is a figure explaining electromotive forces of the power generating device in the first embodiment according to the present invention.

That is, when the power generating device 10 is positioned at the uppermost part of the rim 22 in FIG. 5, the resultant force P1 between the centrifugal force in accordance with the rotation of the tire 20 and the gravity (=centrifugal force−gravity) is applied to the weight 113, so that the beams 111 are deflected to make the coil 121 displaced only by a distance d1, as shown in FIG. 7. Further, when the power generating device 10 is positioned at the lowermost part of the rim 22 in FIG. 5, the resultant force P2 between the centrifugal force in accordance with the rotation of the tire 20 and the gravity (=centrifugal force+gravity) is applied to the weight 113, so that the beams 111 are deflected to make the coil 121 displaced by a distance d2 (>d1), as shown in FIG. 8. Accordingly, as explained with reference to FIG. 2, voltages V1, V2 and V3 as shown in FIG. 9 are generated so that power generation is performed.

Further, as in the above described constitution, the beams 111 are arranged at the opening part of the cavity 114, and the coil 121 is provided so as to be positioned at the center of the opening part of cavity 114. As a result, the change quantity of the magnetic flux density crossing the coil 121 can be made large in accordance with the deflection of the beams 111, to thereby make it possible to increase the electromotive force induced in the coil.

In the present embodiment, when the shape of the above described generator 100 was formed into a size of 2 mm×2 mm×0.5 mm by using a known MEMS (Micro Electro Mechanical System) technique, a voltage of about 10 mV was able to be obtained as an output voltage of the generator.

Note that a smoothing capacitor and a secondary battery may also be used instead of the above described capacitor 300. Further, the output voltage may also be raised up to a desired voltage by using a known double voltage rectifier circuit instead of the rectifier 200, and thereafter stored.

Further, it is also possible that two or more generators 100 are provided and the coils 121 of the respective generators 100 are connected in parallel to thereby increase the current capacity, or alternatively, the coils 121 of the respective generators 100 are connected in series to thereby increase the output voltage.

Figure 10:
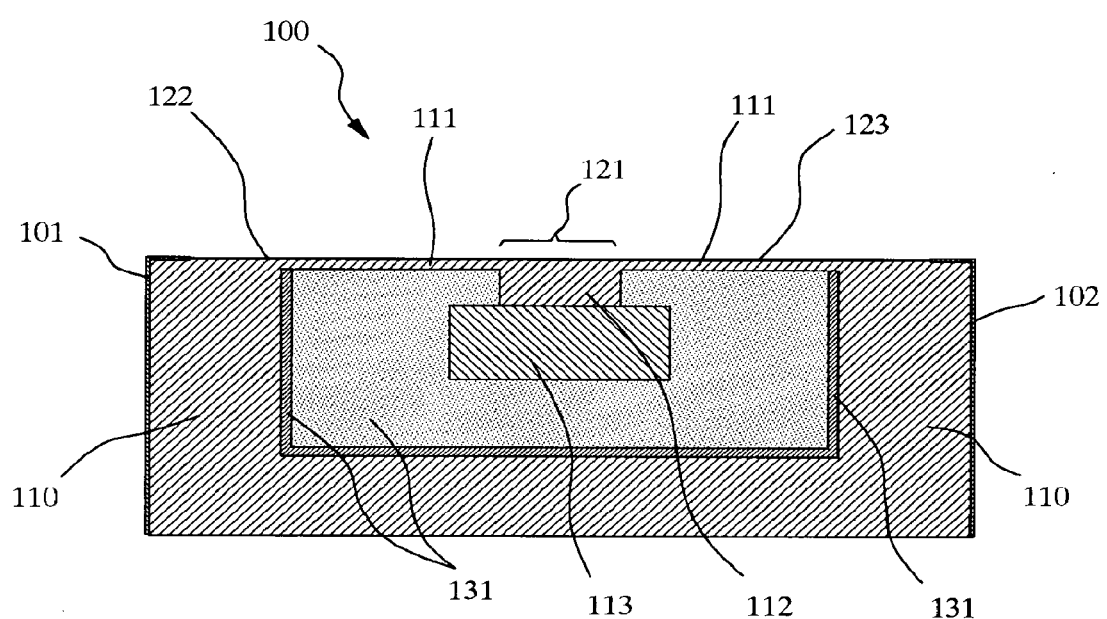
FIG. 10 is a sectional view explaining another constitution example of the generator in the first embodiment according to the present invention.

Further, the generator 100 may be formed to have a shape in which the bottom part of the cavity 114 is closed as shown in FIG. 10.

Further, a constitution in which the positional relationship between the coil 121 and the permanent magnet made of the magnetic material layer 131 is reversed may also be adopted. That is, those skilled in the art will readily appreciate that the same power generation can be performed even if the power generating device 100 is constituted in such a manner that the coil 121 is formed in the cavity 114, and the permanent magnet is provided for the rectangular part 112 or the weight 113. Therefore, it goes without saying that the details of the constitution need no further explanation.

Next, a second embodiment according to the present invention is described.

Figure 11:
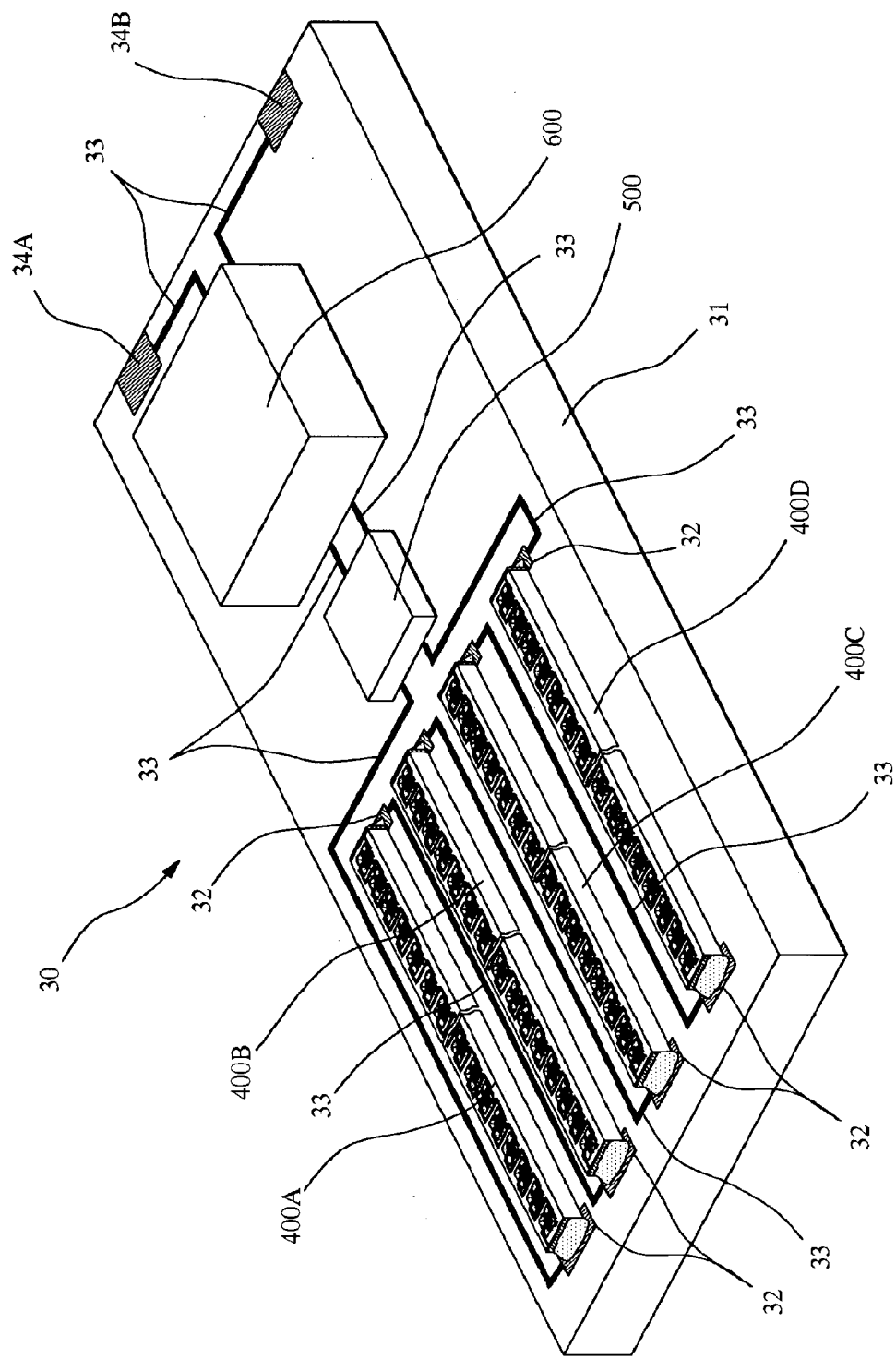
FIG. 11 is an external perspective illustration showing a power generating device in a second embodiment according to the present invention.
Figure 12:
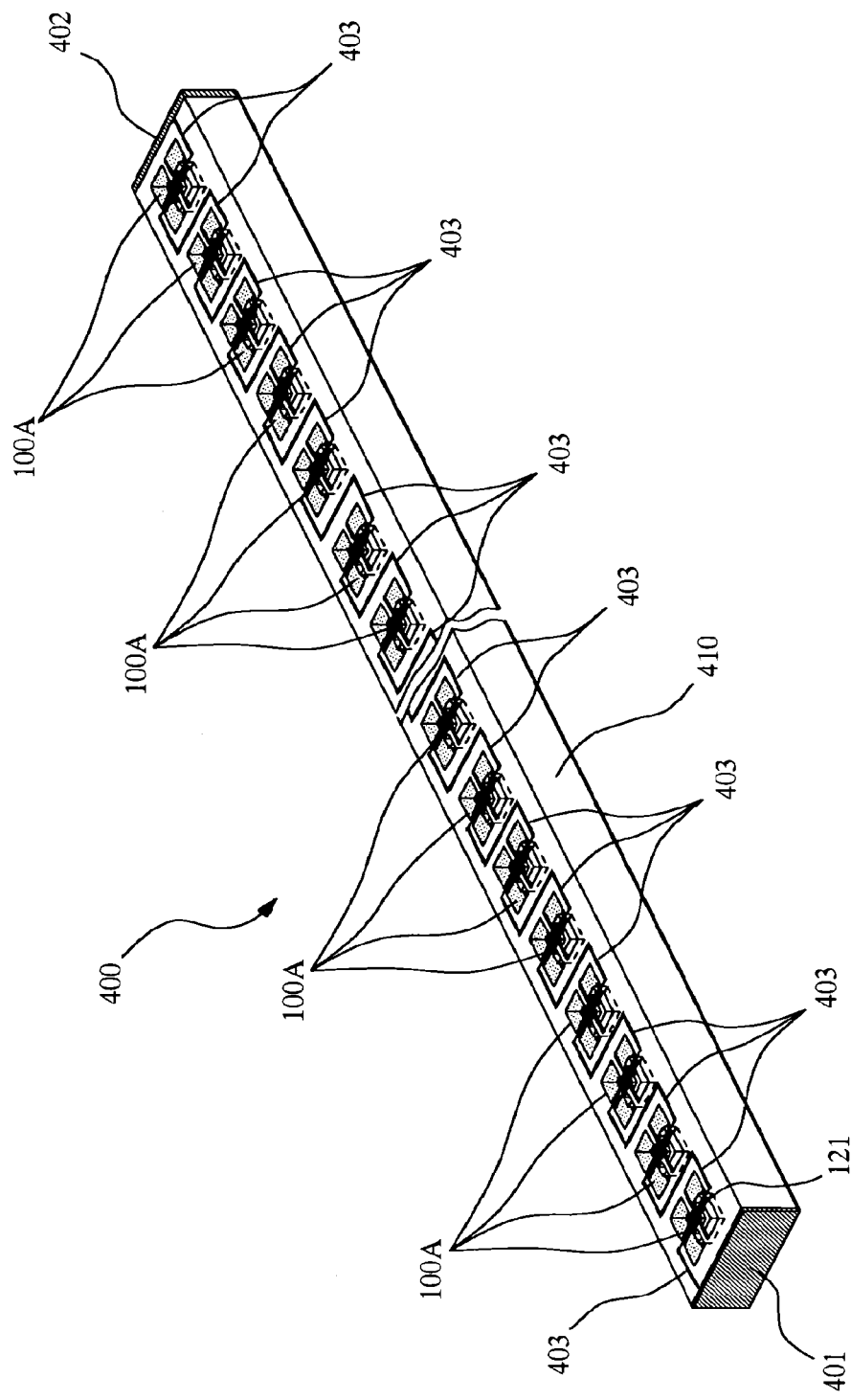
FIG. 12 is an external perspective illustration showing a power generating module in the second embodiment according to the present invention.
Figure 13:
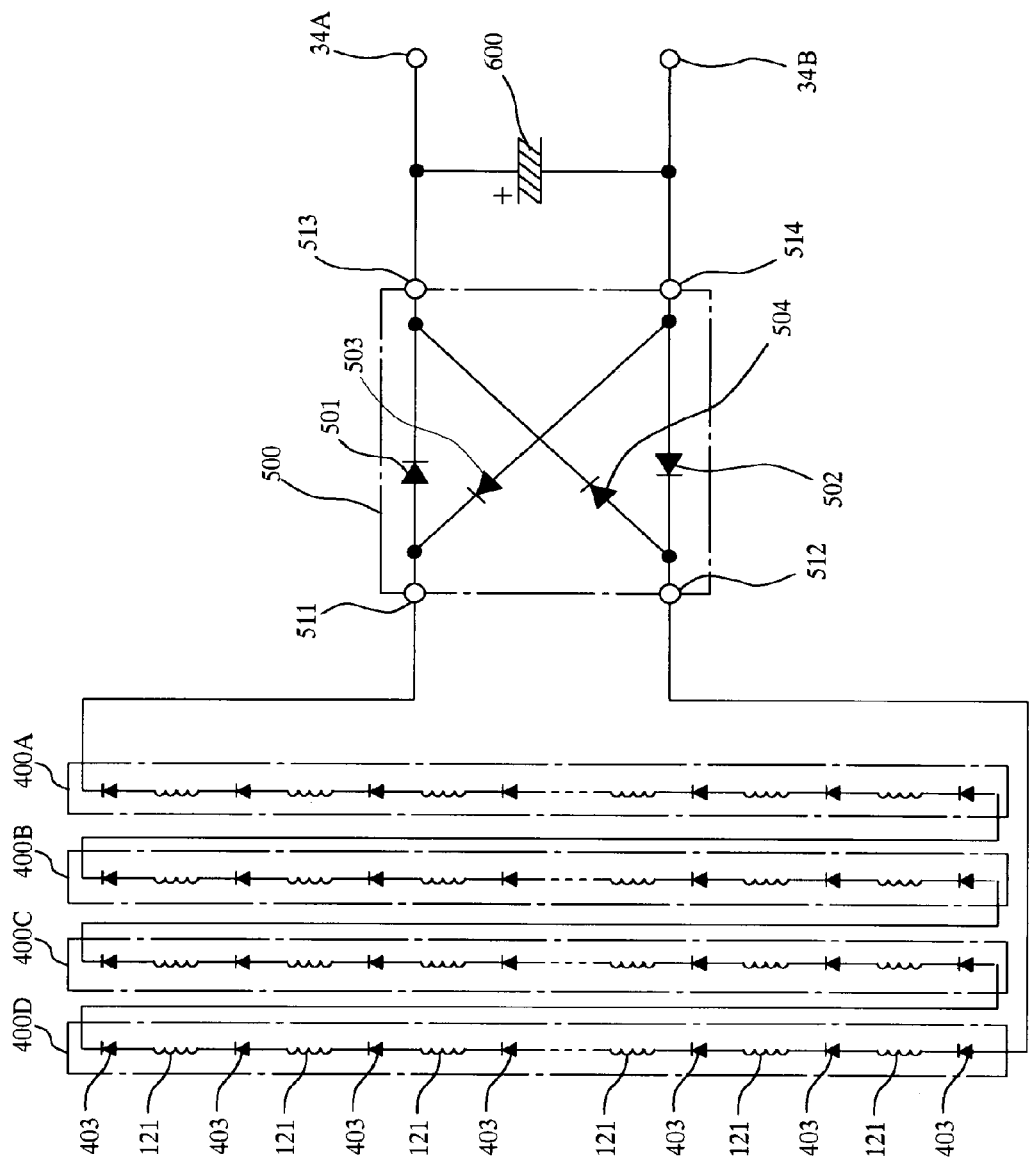
FIG. 13 is an electric system circuit diagram of the power generating device in the second embodiment according to the present invention.

FIG. 11 to FIG. 18 show a second embodiment according to the present invention. FIG. 11 is an external perspective illustration showing a power generating device in the second embodiment according to the present invention. FIG. 12 is an external perspective illustration showing a power generating module in the second embodiment according to the present invention. FIG. 13 is an electric system circuit diagram of the power generating device in the second embodiment according to the present invention.

In the figures, reference numeral 30 denotes a power generating device provided with an insulative substrate 31, and a plurality of power generating modules 400 (400A, 400B, 400C, 400D), a rectifier 500 and a capacitor 600 which are arranged on the substrate 31.

The substrate 31 is formed to have a rectangular plate-like shape, and a plurality of component mounting lands 32, wiring conductor pattern 33, and terminal electrodes 34A and 34B, each of which is made of a conductive body, are formed on the upper surface of the substrate 31.

Further, external terminal electrodes 401 and 402 of the power generating modules 400 (400A, 400B, 400C, 400D) are conductively connected to the lands 32 by soldering, and thereby the respective power generating modules 400 (400A, 400B, 400C, 400D) are fixed on the substrate 31. Further, the respective power generating modules 400 (400A, 400B, 400C, 400D) are connected in series by the wiring conductor pattern 33.

Further, on the substrate 31, the rectifier 500 and the capacitor 600 are fixed by soldering to lands (not shown) connected to the wiring conductor pattern 33.

As shown in FIG. 12, each of the power generating modules 400 (400A, 400B, 400C, 400D) is mainly constituted by a rectangular parallelepiped silicon substrate (silicon wafer) 410, and a plurality of generators 100A are arranged in a row in the longitudinal direction of the silicon substrate 410. The constitution of each generator 100A is the same as that of the generator 100 of the above described first embodiment. The coils 121 of the adjacent generators 100A are connected in series to each other via diodes 403, and the coils 121 at both ends of the serially connected coils are connected to the external terminal electrode 401 and 402 via the diodes 403, respectively. These diodes 403 are directly formed on the silicon substrate 410 by using a semiconductor technology. In the present embodiment, 50 generators 100A are formed in one power generating module 400, and the coils 121 of the generators 100A are connected in series via the diodes 403.

Further, the serially connected power generating modules 400 (400A, 400B, 400C, 400D), the rectifier 500, and the capacitor 600 are connected by a wiring conductor pattern as shown in FIG. 11 and FIG. 13. That is, one end of the serially connected power generating modules 400 (400A, 400B, 400C, 400D) is connected to one input terminal 511 of the rectifier 500 via the external terminal electrode, and the other end of the serially connected power generating modules is connected to the other input terminal 512 of the rectifier 500 via the external terminal electrode.

The rectifier 500 is constituted by a known full-wave rectifier circuit consisting of four diodes 501 to 504. The anode of the diode 501 and the cathode of the diode 503 are connected to the one input terminal 511 of the rectifier 500. The cathode of the diode 502 and the anode of the diode 504 are connected to the other input terminal 512 of the rectifier 500. Further, the cathode of the diode 501 and the cathode of the diode 504 are connected to one output terminal 513, and the anode of the diode 502 and the anode of the diode 503 are connected to the other output terminal 514.

The one output terminal 513 of the rectifier 500 is connected to a positive electrode terminal of the capacitor 600 consisting of a large capacity capacitor generally referred to as a super capacitor and to the terminal electrode 34A, and the other output terminal 514 of the rectifier 500 is connected to a negative electrode terminal of the capacitor 600 and the terminal electrode 34B. Thus, when AC power is generated in the coil 121 of each generator 10A, the resultant AC voltage is converted to a voltage which is full-wave rectified by the rectifier 500. Thereafter, the rectified voltage is smoothed by being stored in the capacitor 600, so as to be outputted as a DC voltage from the terminal electrodes 34A and 34B.

Further, since 200 generators 100A are connected in series in the present embodiment, when it is assumed that the output voltage of one generator 100A is 10 mV as in the case of the first embodiment, the output voltage of 2 V as a whole can be obtained.

Thus, by using the power generating module 400 having a plurality of generators 100A formed in this way, the output voltage of a desired value can be easily obtained. Further, in the case where the power generating device 30 is constituted by combining two or more power generating modules 400, when a failure occurs in one of the power generating modules 400, it is only necessary to replace the power generating module 400 in failure. Therefore, it is also possible to obtain a desirable effect in the manufacturing yield, the manufacturing cost, and the like.

Note that when current capacity needs to be increased, two or more power generating modules 400 may be connected in parallel, and the power generating modules 400 connected in parallel may further be connected in series. In addition, the power generating module may also be constituted by connecting a plurality of the generators 100A in parallel. Further, the power generating module may also be constituted by connecting a plurality of generators 100A in parallel and series.

Further, in the present embodiment, the generators 100A are mutually connected by using the diodes, but the generators 100A may also be mutually connected by using rectifying elements other than the diodes.

Next, a third embodiment according to the present invention is described.

Figure 14:
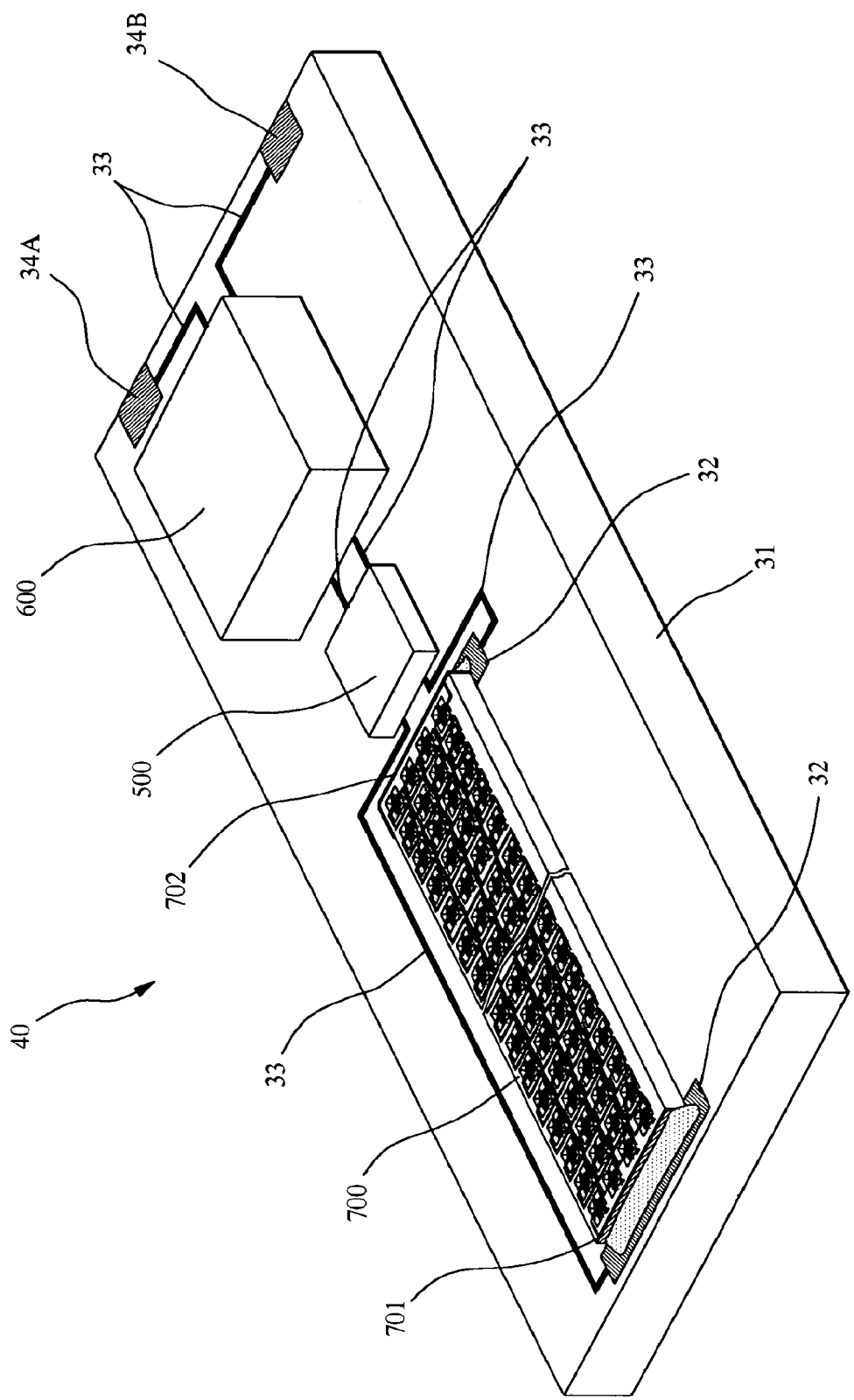
FIG. 14 is an external perspective illustration showing a power generating device in a third embodiment according to the present invention.
Figure 15:
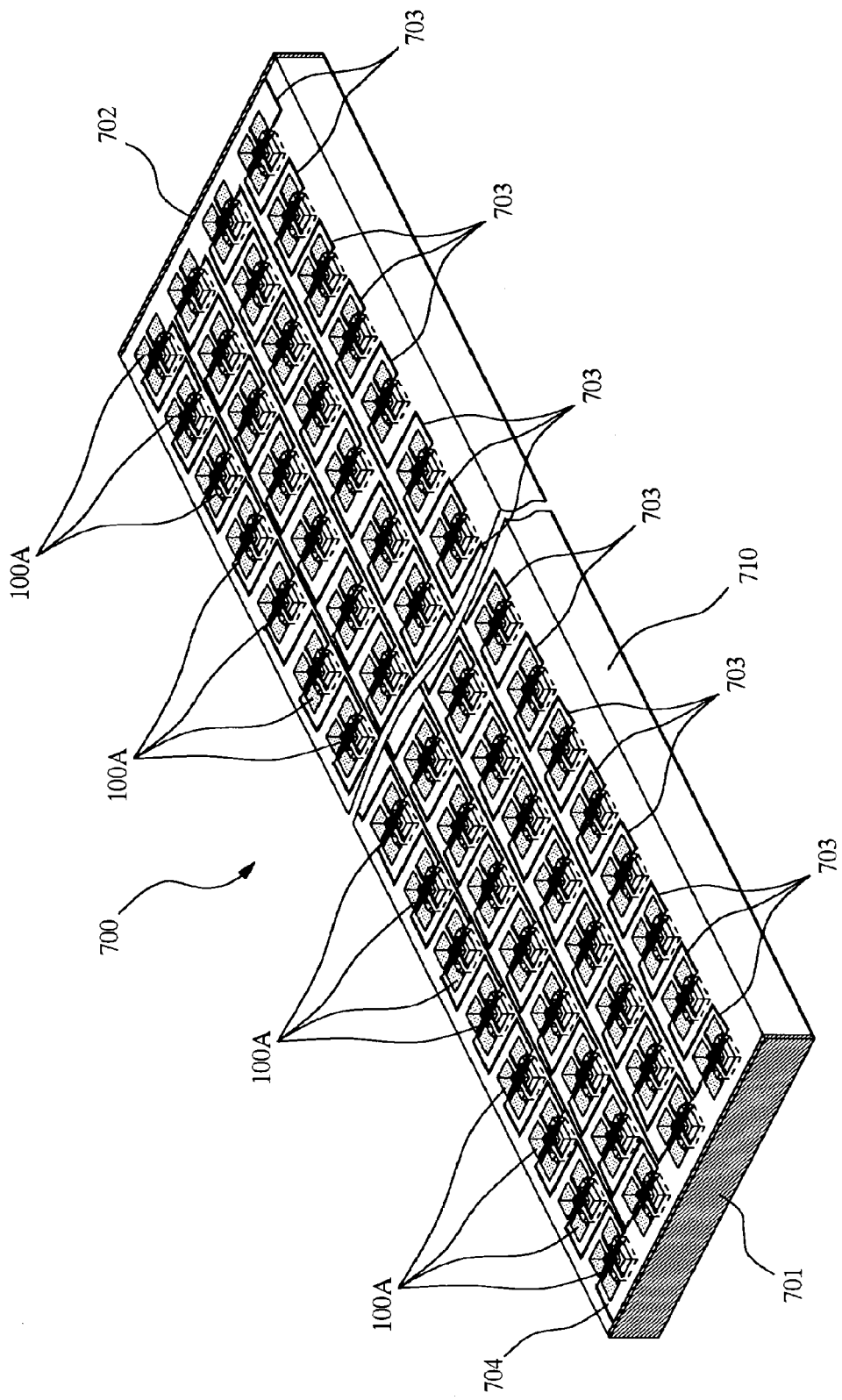
FIG. 15 is an external perspective illustration showing a power generating module in the third embodiment according to the present invention.
Figure 16:
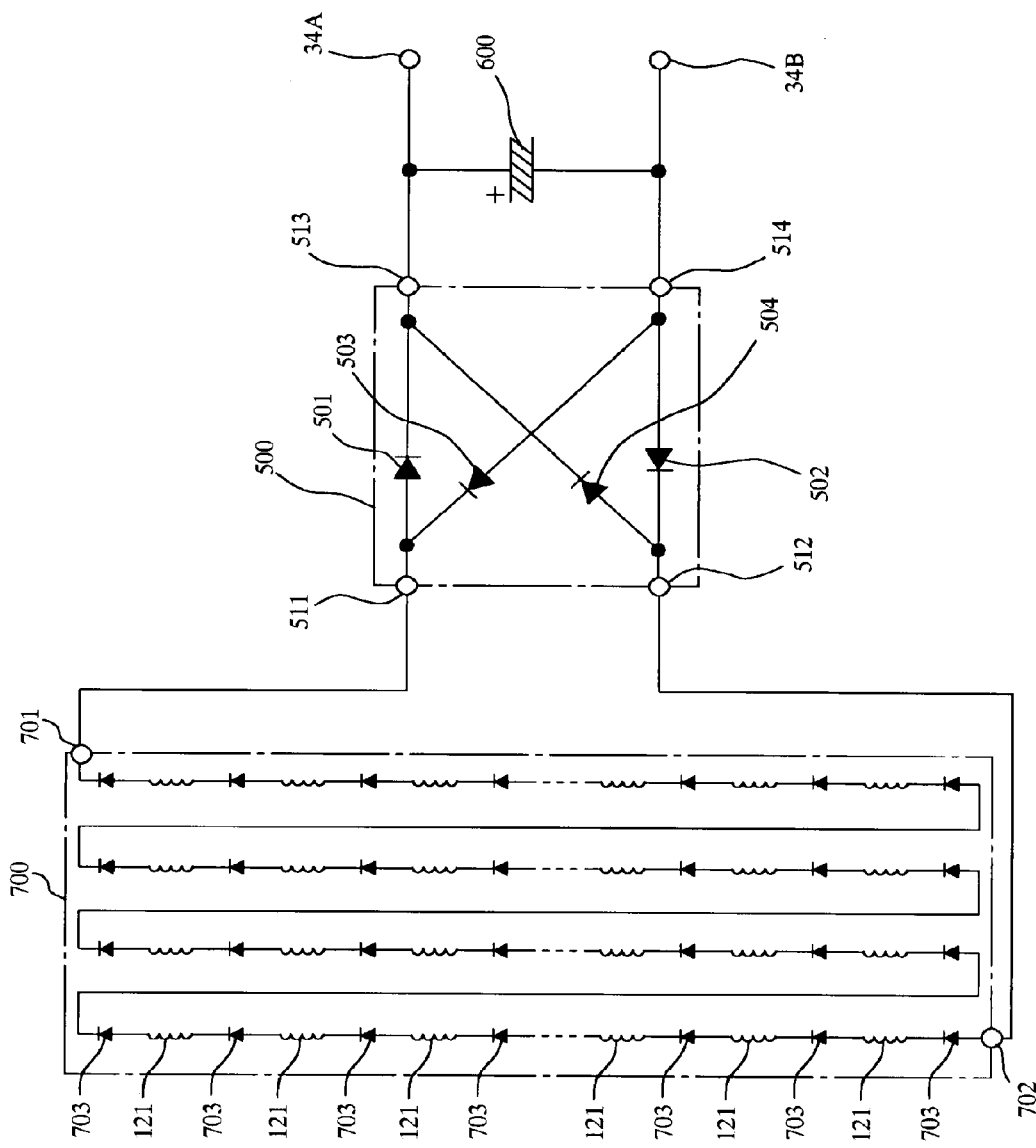
FIG. 16 is an electric system circuit diagram of the power generating device in the third embodiment according to the present invention.

FIG. 14 to FIG. 16 show a third embodiment according to the present invention. FIG. 14 is an external perspective illustration showing a power generating device in the third embodiment according to the present invention. FIG. 15 is an external perspective illustration showing a power generating module in the third embodiment according to the present invention. FIG. 16 is an electric system circuit diagram of the power generating device in the third embodiment according to the present invention.

In the figures, the same components as those in the above described first and second embodiments are denoted by the same reference numerals and characters, and the explanation of the components is omitted. Reference numeral 40 denotes a power generating device, and is provided with an insulative substrate 31, and a power generating module 700, a rectifier 500 and a capacitor 600 which are arranged on the substrate 31.

The substrate 31 is formed to have a rectangular plate-like shape, and component mounting lands 32, a wiring conductor pattern 33, and terminal electrodes 34A and 34B, each of which is made of a conductive body, are formed on the upper surface of the substrate 31.

Further, external terminal electrodes 701 and 702 of the power generating module 700 are conductively connected to the lands 32 by soldering, and thereby the generating module 700 is fixed on the substrate 31.

Further, on the substrate 31, the rectifier 500 and the capacitor 600 are fixed by soldering to lands (not shown) connected to the wiring conductor pattern 33.

As shown in FIG. 15, the power generating module 700 is mainly constituted by a rectangular parallelepiped silicon substrate (silicon wafer) 710. On the silicon substrate 710, 200 generators 100A are formed so as to be arranged in 4 columns and 50 rows. The constitution of each of the generators 100A is the same as that of the generator 100 in the above described first embodiment, and coils 121 of adjacent generators 100A are connected in series to each other via diodes 703 in the respective columns, and the serially connected coils 121 of the respective columns are also connected in series. Further, the coils 121 at both ends of the coils serially connected in this way are connected to the external terminal electrodes 701 and 702 via the diodes 703, respectively. These diodes 703 are directly formed on the silicon substrate 710 by using a semiconductor technology.

Further, the power generating module 700, the rectifier 500, and the capacitor 600 are connected by a wiring conductor pattern as shown in FIG. 14 and FIG. 16. That is, the one external terminal electrode 701 of the power generating module 700 is connected to one input terminal 511 of the rectifier 500, and the other external terminal electrode 702 of the power generating module is connected to the other input terminal 512 of the rectifier 500.

The rectifier 500 is constituted by a known full-wave rectifier circuit consisting of four diodes 501 to 504. The anode of the diode 501 and the cathode of the diode 503 are connected to the one input terminal 511 of the rectifier 500, and the cathode of the diode 502 and the anode of the diode 504 are connected to the other input terminal 512. Further, the cathode of the diode 501 and the cathode of the diode 504 are connected to one output terminal 513 of the rectifier 500, and the anode of the diode 502 and the anode of the diode 503 are connected to the other output terminal 514.

The one output terminal 513 of the rectifier 500 is connected to a positive electrode terminal of the capacitor 600 consisting of a large capacity capacitor generally referred to as a super capacitor and to the terminal electrode 34A, and the other output terminal 514 of the rectifier 500 is connected to a negative electrode terminal of the capacitor 600 and the terminal electrode 34B. Thereby, when AC power is generated in the coil 121 of the respective generators 10A, the resultant AC voltage is converted to a voltage which is full-wave rectified by the rectifier 500. Thereafter, the rectified voltage is smoothed by being stored in the capacitor 600 so as to be outputted as a DC voltage from the terminal electrodes 34A and 34B.

Further, since 200 generators 100A are connected in series in the present embodiment, when it is assumed that the output voltage of one generator 100A is 10 mV as in the case of the first embodiment, the output voltage of 2 V as a whole can be obtained.

By constituting one power generating module 700 which enables desired output power to be obtained as described above, it is possible to make the manufacturing process of the power generating device 40 more simplified as compared with the second embodiment, and to thereby reduce the manufacturing cost of the power generating device.

Next, a fourth embodiment according to the present invention is described.

Figure 17:
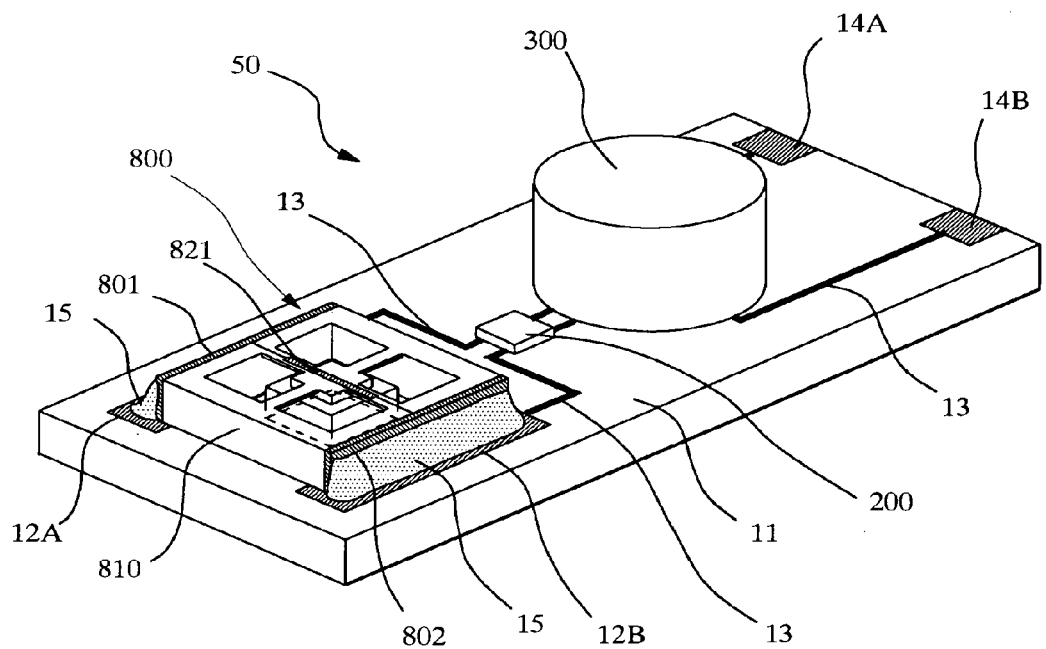
FIG. 17 is an external perspective illustration showing a power generating device in a fourth embodiment according to the present invention.
Figure 18:
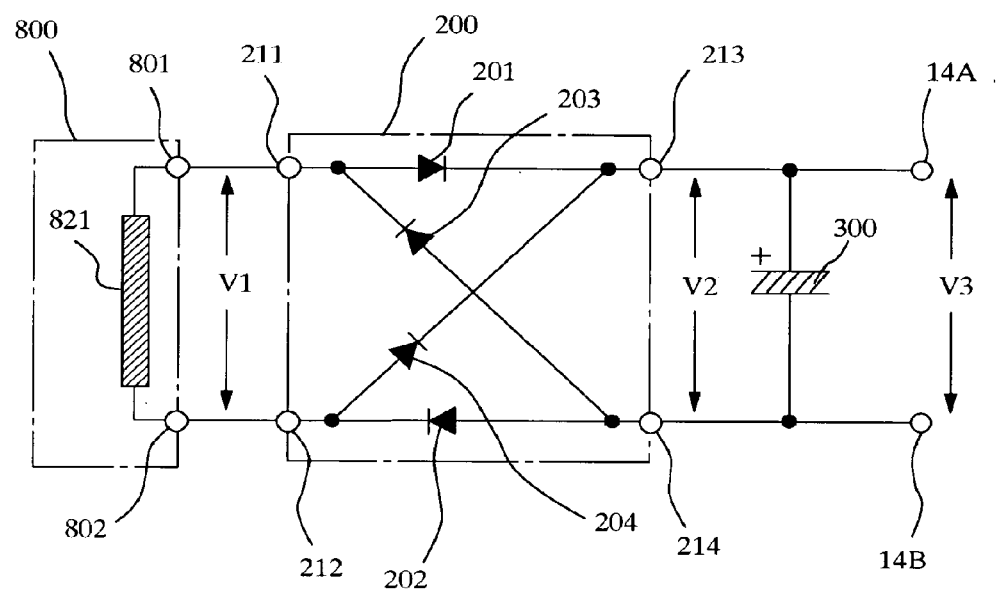
FIG. 18 is an electric system circuit diagram of the power generating device in the fourth embodiment according to the present invention.
Figure 19:
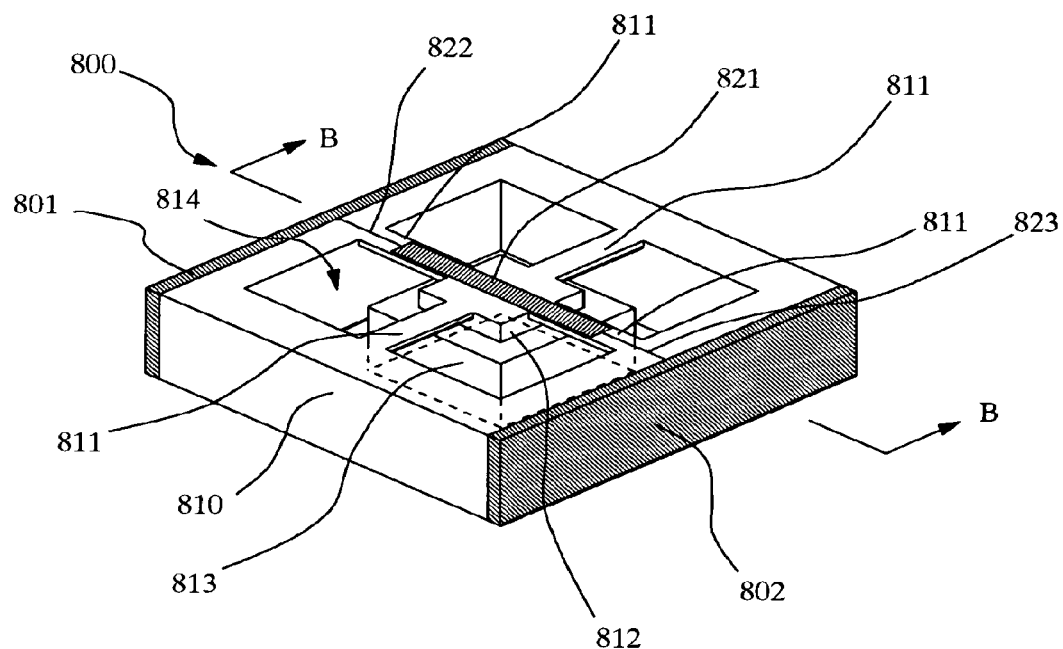
FIG. 19 is an external perspective illustration showing a generator in the fourth embodiment according to the present invention.
Figure 20:
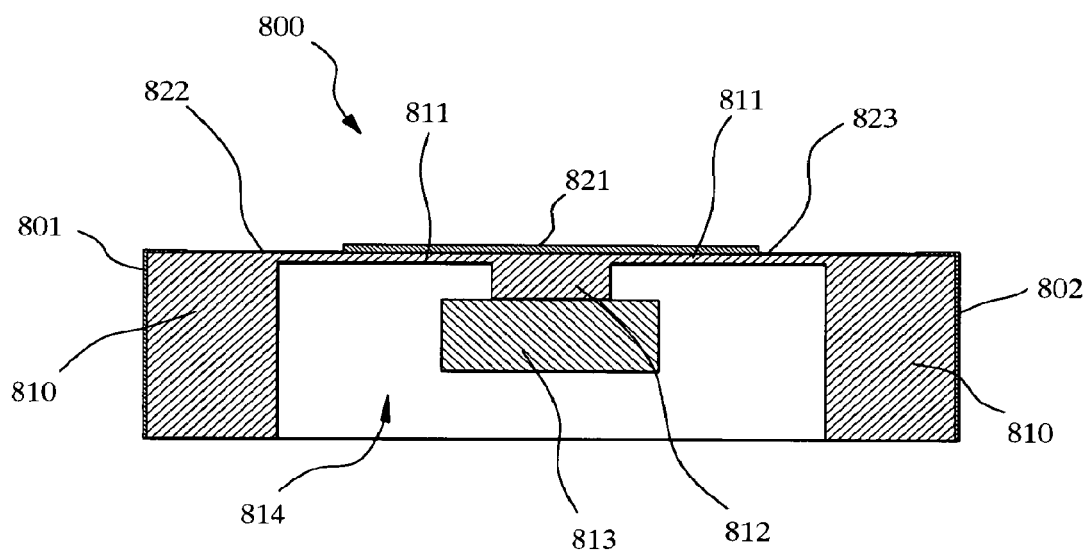
FIG. 20 is a sectional view along the line B-B shown in FIG. 19.

FIG. 17 to FIG. 20 show a fourth embodiment according to the present invention. FIG. 17 is an external perspective illustration showing a power generating device in the fourth embodiment according to the present invention. FIG. 18 is an electric system circuit diagram of the power generating device in the fourth embodiment according to the present invention. FIG. 19 is an external perspective illustration showing a generator in the fourth embodiment according to the present invention. FIG. 20 is a sectional view along the line B-B shown in FIG. 19.

In the figures, reference numeral 50 denotes a power generating device provided with an insulative substrate 11, and a generator 800, a rectifier 200 and a capacitor 300 which are arranged on the substrate 11.

The substrate 11 is formed to have a rectangular plate-like shape, and component mounting lands 12A and 12B, a wiring conductor pattern 13, and terminal electrodes 14A and 14B, each of which is made of a conductive body, are formed on the upper surface of the substrate 11.

Further, external terminal electrodes 801 and 802 of the generator 800 are conductively connected to the lands 12A and 12B by solder 15, and thereby the generator 800 is fixed on the substrate 11. Further, on the substrate 11, the rectifier 200 and the capacitor 300 are fixed by soldering to lands (not shown) connected to the wiring conductor pattern 13.

Further the generator 800, the rectifier 200, and the capacitor 300 are connected by a wiring conductor pattern 13 as shown in FIG. 18. That is, one end of a piezoelectric element 821 provided for the generator 800 is connected to one input terminal 211 of the rectifier 200 via the external terminal electrode 801, and the other end of the piezoelectric element 821 is connected to the other input terminal 212 of the rectifier 200 via the external terminal electrode 802.

The rectifier 200 is constituted by a known full-wave rectifier circuit consisting of four diodes 201 to 204. The anode of the diode 201 and the cathode of the diode 203 are connected to the one input terminal 211 of the rectifier 200, and the cathode of the diode 202 and the anode of the diode 204 are connected to the other input terminal 212. Further, the cathode of the diode 201 and the cathode of the diode 204 are connected to one output terminal 213, and the anode of the diode 202 and the anode of the diode 203 are connected to the other output terminal 214.

The one output terminal 213 of the rectifier 200 is connected to a positive electrode terminal of the capacitor 300 consisting of a large capacity capacitor generally referred to as a super capacitor and to the terminal electrode 14A, and the other output terminal 214 of the rectifier 200 is connected to a negative electrode terminal of the capacitor 300 and the terminal electrode 14B. Thus, when AC power is generated in the piezoelectric element 821, the resultant AC voltage V1 is converted to a voltage V2 which is full-wave rectified by the rectifier 200. Thereafter, the rectified voltage is smoothed by being stored in the capacitor 300, so as to be outputted as a DC voltage V3 from the terminal electrodes 14A and 14B.

On the other hand, as shown in FIG. 19 and FIG. 20, the generator 800 is mainly constituted by a silicon substrate (silicon wafer) 810. A cavity 814 whose bottom part is opened is formed in the central part of the silicon substrate 810, and thin film beams 811 which are formed into a cross shape and fixed to the silicon substrate 810 are provided on the upper part, that is, one of the opening surfaces of the cavity 814.

Further, a rectangular part 812 having a predetermined area is formed in the crossing part of the beams 811, and the piezoelectric element 821 having a rectangular parallelepiped shape is provided on the upper surface of a pair of beams which form a linear shape with the rectangular part 812 as the center of the linear shape. The one end of the piezoelectric element 821 is connected to the external terminal electrode 801 formed on the one side surface of the substrate 810 via a wiring pattern 822 provided on the upper surface of one of the pair of beams 811. Further, the other end of the piezoelectric element 821 is connected to the external terminal electrode 802 formed on the other side surface of the substrate 810 via a wiring pattern 823 provided on the upper surface of the other of the pair of beams 811.

Further, under the rectangular part 812 in the crossing part of the beams 811, a weight 813 is provided so as to be fixed to the rectangular part 812.

The power generating device 50 having the above described constitution is suitable for generating electric power by being provided in a rotating body. For example, in the case where the power generating device 50 is provided in a tire 20 of a vehicle so as to generate electric power similarly to the case shown in FIG. 5, the power generating device 50 is fixed to the peripheral surface of a rim 22 for fixing a tire body 21 in the tire 20. Thereby, when the tire 20 is rotated about a rotating shaft 23, the force applied to the weight 813 of the generator 800 is changed in accordance with the rotation of the tire 20, so that the beams 811 are deflected and vibrated to cause the piezoelectric element 821 to be distorted. As a result, alternating electromotive forces are generated in the piezoelectric element 821.

In the present embodiment, when the shape of the above described generator 800 was formed into a size of 2 mm×2 mm×0.5 mm by using a known MEMS (Micro Electro Mechanical System) technique, a voltage of about 10 mV was able to be obtained as an output voltage of the generator.

Note that a smoothing capacitor and a secondary battery may also be used instead of the above described capacitor 300. Further, the output voltage may also be raised up to a desired voltage by using a known double voltage rectifier circuit instead of the rectifier 200, and thereafter stored.

Further, it is also possible that two or more generators 800 are provided, and the piezoelectric elements 821 of the respective generators are connected in parallel to thereby increase the current capacity, or alternatively, the piezoelectric elements 821 of the respective generators 800 are connected in series to thereby increase the output voltage.

Further, the generator 800 may also be formed to have a shape in which the bottom part of the cavity 814 is closed.

Further, it is also possible that a module in which a plurality of generators 800 are integrated so as to be connected by diodes, similarly to the embodiment 2 to the embodiment 3 as described above, is formed, and a power generating device is constituted by using the module.

INDUSTRIAL APPLICABILITY

Only by providing the power generating device according to the present invention, AC power synchronized with the period of the rotation can be generated due to the fluctuation of the position of the weight caused in accordance with the rotation, whereby electric power can be easily supplied to, for example, a sensor module provided in the rotating body.

The invention claimed is:

1. A power generating device which has a predetermined rotating shaft in a direction different from the direction of gravity, which is provided in a rotating body rotating about the rotating shaft at a predetermined period, and which generates electric power while rotating about the rotating shaft, characterized by having a generator comprising:
    a flexible beam which is fixed to a substrate;
    a weight which is supported by the beam and the position of which is fluctuated in synchronization with the period of the rotation by deflection of the beam caused in accordance with the rotation; and
    AC generating means which generates AC power synchronized with the period of the rotation by the fluctuation of the position of the weight.

2. The power generating device according to claim 1, wherein the beam is arranged in an opening part of a cavity formed in the substrate, and the weight is supported to be positioned at the center of the opening part of the cavity, and
    wherein the AC generating means comprises:
        a permanent magnet provided in the cavity formed on the substrate; and
        a coil formed in at least one of the weight and the beam.

3. The power generating device according to claim 2, further comprising a rectifying circuit whose input side is connected to ends of the coil.

4. The power generating device according to claim 3, further comprising a power storage means connected to an output side of the rectifying circuit.

5. The power generating device according to claim 2 further comprising a plurality of the generators, the respective coils of which are mutually connected in series or in parallel via rectifying elements.

6. The power generating device according to claim 2, further comprising a plurality of the generators, the output sides of which are mutually connected in series or in parallel.

7. A tire comprising the power generating device according to claim 2.

8. The power generating device according to claim 1,
    wherein the beam is arranged in an opening part of a cavity formed in the substrate, and the weight includes a permanent magnet which is supported by the beam, to be positioned at the center of the opening part of the cavity, and
    wherein the AC generating means comprises:
        the permanent magnet; and
        a coil formed in a predetermined position in the cavity.

9. The power generating device according to claim 8, further comprising a rectifying circuit whose input side is connected to ends of the coil.

10. The power generating device according to claim 9, further comprising a power storage means connected to an output side of the rectifying circuit.

11. The power generating device according to claim 8, further comprising a plurality of the generators, the output sides of which are mutually connected in series or in parallel.

12. The power generating device according to claim 8, further comprising a plurality of the generators, the respective coils of which are mutually connected in series or in parallel via rectifying elements.

13. A tire comprising the power generating device according to claim 8.

14. The power generating device according to claim 1, wherein the AC generating means comprises a piezoelectric element which is provided for the beam and has power output terminals.

15. The power generating device according to claim 14, further comprising a rectifying circuit whose input side is connected to the power output terminals.

16. The power generating device according to claim 15, further comprising power storage means connected to an output side of the rectifying circuit.

17. The power generating device according to claim 1, further comprising a plurality of the generators, the output sides of which are mutually connected in series or in parallel.

18. The power generating device according to claim 1, wherein the generator is formed in a silicon wafer substrate.

19. A tire comprising the power generating device according to claim 1.

* * * * *